(12) United States Patent
Rim

(10) Patent No.: US 9,418,758 B2
(45) Date of Patent: Aug. 16, 2016

(54) TEST CIRCUIT OF SEMICONDUCTOR APPARATUS

(71) Applicant: SK hynix Inc., Icheon-si Gyeonggi-do (KR)

(72) Inventor: A Ram Rim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 198 days.

(21) Appl. No.: 14/248,429

(22) Filed: Apr. 9, 2014

(65) Prior Publication Data

US 2015/0187434 A1    Jul. 2, 2015

(30) Foreign Application Priority Data

Dec. 30, 2013    (KR) .................. 10-2013-0167000

(51) Int. Cl.
| | | |
|---|---|---|
| *G11C 5/06* | (2006.01) | |
| *G06F 11/26* | (2006.01) | |
| *G11C 29/08* | (2006.01) | |
| *G11C 29/40* | (2006.01) | |

(52) U.S. Cl.
CPC ................ *G11C 29/08* (2013.01); *G06F 11/26* (2013.01); *G11C 29/40* (2013.01)

(58) Field of Classification Search
CPC ............... G11C 5/025; G11C 11/4085; G11C 11/4097; G06F 11/26
USPC .............. 714/718, 719; 365/200, 230.03, 208
See application file for complete search history.

(56) References Cited

U.S. PATENT DOCUMENTS

| | | | | |
|---|---|---|---|---|
| 7,589,997 | B2 * | 9/2009 | Honma ............... | G06F 11/1068 365/185.03 |
| 8,839,074 | B2 * | 9/2014 | Tam .................... | G06F 11/1044 711/155 |
| 8,959,420 | B1 * | 2/2015 | Piszczek ................ | G06F 12/10 714/6.22 |
| 9,021,343 | B1 * | 4/2015 | Hu ........................ | G11C 29/785 365/185.03 |
| 2013/0077420 | A1 * | 3/2013 | Iwai ........................ | G11C 29/76 365/200 |

FOREIGN PATENT DOCUMENTS

KR         100172413 B1    10/1998

* cited by examiner

*Primary Examiner* — Phung M Chung
(74) *Attorney, Agent, or Firm* — William Park & Associates Ltd.

(57) ABSTRACT

A test circuit of a semiconductor apparatus includes a plurality of memory blocks, and a comparison block configured to compare data of two memory blocks, wherein the two of the plurality of memory blocks do not share word lines.

14 Claims, 3 Drawing Sheets

TEST CIRCUIT OF SEMICONDUCTOR APPARATUS

CROSS-REFERENCES TO RELATED APPLICATION

The present application claims priority under 35 U.S.C. §119(a) to Korean application number 10-2013-0167000, filed on Dec. 30, 2013, in the Korean Intellectual Property Office, which is incorporated herein by reference in its entirety.

BACKGROUND

1. Technical Field

Various embodiments relate to a semiconductor apparatus, and more particularly, to a test circuit of a semiconductor apparatus.

2. Related Art

A semiconductor apparatus often tests whether the storage of data is being properly implemented.

In many cases, such a test process requires a relatively lengthy period of time. Shortening the test time period may improve the yield of a product. A parallel test mode may be used to shorten the test time period.

A parallel test mode is defined as a testing scheme during which a plurality of bits data are processed at a time during a write operation and output during a read operation.

SUMMARY

In an embodiment, a test circuit of a semiconductor apparatus may include a plurality of memory blocks, and a comparison block configured to compare data of two of the plurality of memory blocks, wherein the two of the plurality of memory blocks do not share word lines.

In an embodiment, a test circuit of a semiconductor apparatus may include a plurality of memory blocks, a first comparison block configured to select a first pair of alternate memory blocks in series of the plurality of memory blocks, and to compare data of the selected first pair of alternate memory blocks, and a second comparison block configured to select a second pair of alternate memory blocks in the series of the plurality of memory blocks, and to compare data of the selected second pair of alternate memory blocks, wherein the memory blocks in the first pair of memory blocks is different from the memory blocks in the second pair of memory blocks.

DETAILED DESCRIPTION

Various embodiments of a test circuit of a semiconductor apparatus will be described below with reference to the accompanying drawings.

Figure 1:
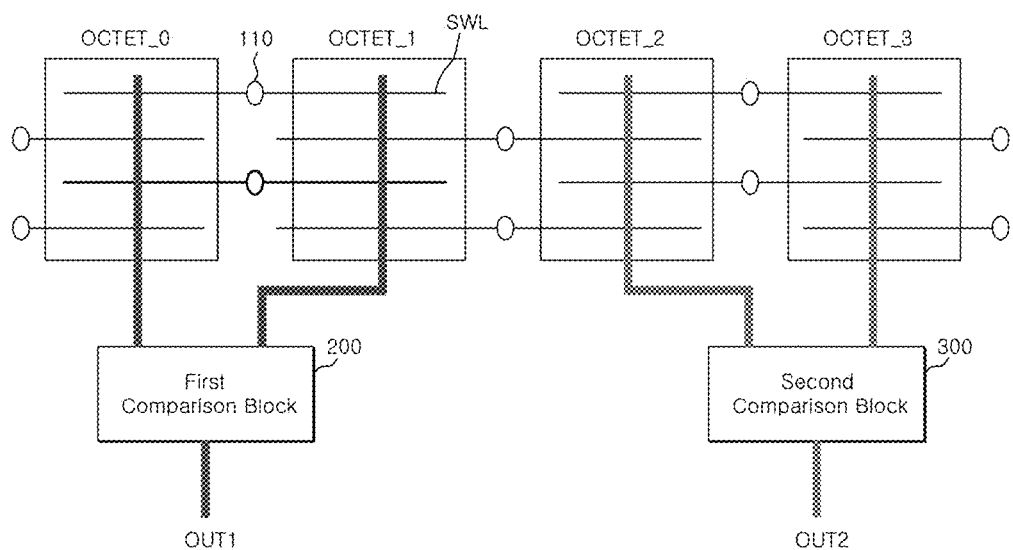
FIG. 1 is a block diagram representation of an embodiment of a test circuit of a semiconductor apparatus.

As shown in FIG. 1, an embodiment of a test circuit 100 of a semiconductor apparatus may include a plurality of memory blocks OCTET_0, OCTET_1, OCTET_2, OCTET_3, a first comparison block 200, and a second comparison block 300.

A plurality of word lines, such as for example, a plurality of sub word lines SWL may be disposed in each of the plurality of memory blocks OCTET_0, OCTET_1, OCTET_2, OCTET_3.

A main word line (MWL) (not shown) may be allocated for a predetermined number of sub word lines SWL from among the plurality of sub word lines SWL.

A plurality of sense amplifiers 110 are shared by pairs of adjacent memory blocks among the plurality of memory blocks OCTET_0, OCTET_1, OCTET_2, OCTET_3.

A first subset of the plurality of memory blocks OCTET_0, OCTET_1, OCTET_2, OCTET_3, such as for example memory blocks OCTET_0 and OCTET_1 may share even-numbered sub word lines SWL. A second subset of the plurality of memory blocks OCTET_0, OCTET_1, OCTET_2, OCTET_3, such as for example the memory blocks OCTET_1 and OCTET_2 may share odd-numbered sub word lines SWL. A third subset of the plurality of memory blocks OCTET_0, OCTET_1, OCTET_2, OCTET_3, such as for example the memory blocks OCTET_2 and OCTET_3 may share even-numbered sub word lines SWL.

The sense amplifiers 110 may be electrically coupled to the shared sub word lines SWL and may be configured to perform input/output of data operations via the shared sub word lines SWL.

The first comparison block 200 may be configured to compare the data of two adjacent memory blocks, such as for example the memory blocks OCTET_0 and OCTET_1, and generate a comparison result signal OUT1 indicating one of a pass and a fail.

The second comparison block 300 may be configured to compare the data of two adjacent memory blocks, such as for example the memory blocks OCTET_2 and OCTET_3, and generate a comparison result signal OUT2 indicating one of a pass and a fail.

Figure 2:
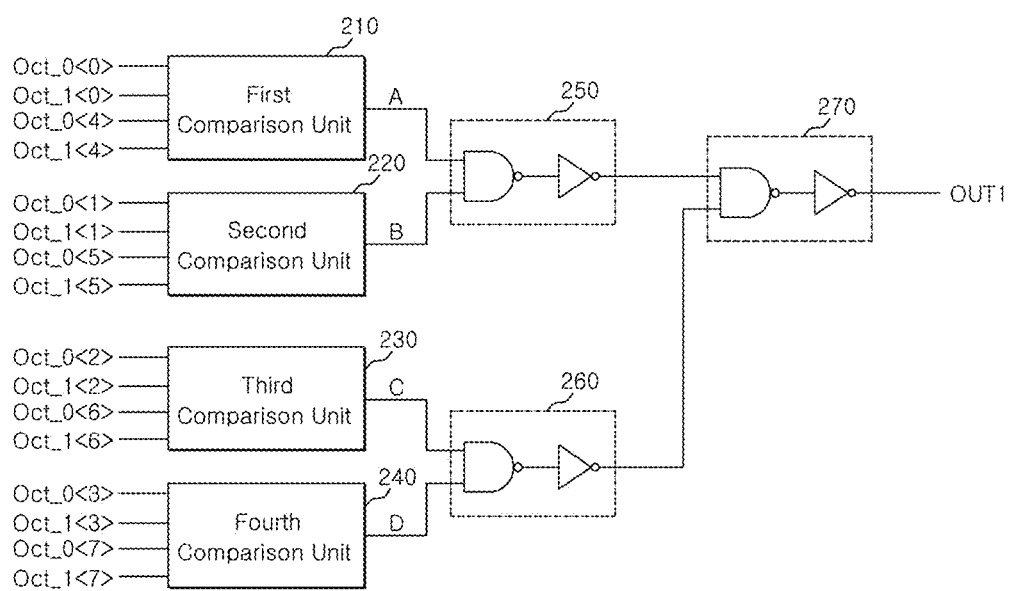
FIG. 2 is a circuit diagram representation of an example of the first comparison block shown in FIG. 1.

As shown in FIG. 2, an example of the first comparison block 200 may include first, second, third and fourth comparison units 210, 220, 230, 240 and first, second and third combination units 250, 260, 270.

The first comparison unit 210 may be configured to compare 2-bit data Oct_0<0>, Oct_1<0>, Oct_0<4> and Oct_1<4> of the memory blocks OCTET_0 and OCTET_1, and generate an output signal A.

The second comparison unit 220 may be configured to compare 2-bit data Oct_0<1>, Oct_1<1>, Oct_0<5> and Oct_1<5> of the memory blocks OCTET_0 and OCTET_1 and generate an output signal B.

The third comparison unit 230 may be configured to compare 2-bit data Oct_0<2>, Oct_1<2>, Oct_0<6> and Oct_1<6> of the memory blocks OCTET_0 and OCTET_1 and generate an output signal C.

The fourth comparison unit 240 may be configured to compare 2-bit data Oct_0<3>, Oct_1<3>, Oct_0<7> and Oct_1<7> of the memory blocks OCTET_0 and OCTET_1 and generate an output signal D.

The first combination unit 250 may be configured to receive the output signal A of the first comparison unit 210 and the output signal B of the second comparison unit 220 as inputs, perform an AND operation on the received inputs.

The second combination unit 260 may be configured to receive the output signal C of the third comparison unit 230 and the output signal D of the fourth comparison unit 240 as inputs and perform an AND operation on the received inputs.

The third combination unit 270 may be configured to receive the output signal of the first combination unit 250 and the output signal of the second combination unit 260 as inputs, and generate a comparison result signal OUT1 based on the received inputs.

The first, second, third and fourth comparison units 210, 220, 230, 240 may be configured to generate respective output signals A, B, C, D having a low logic level when any one of the compared data fails to correspond in its logic level to the other data.

When any one of the output signals A, B, C, D has a low logic level, the comparison result signal OUT1 is output as a low logic level. The comparison result signal OUT1 having a low logic level indicates a failure of the test.

Figure 3:
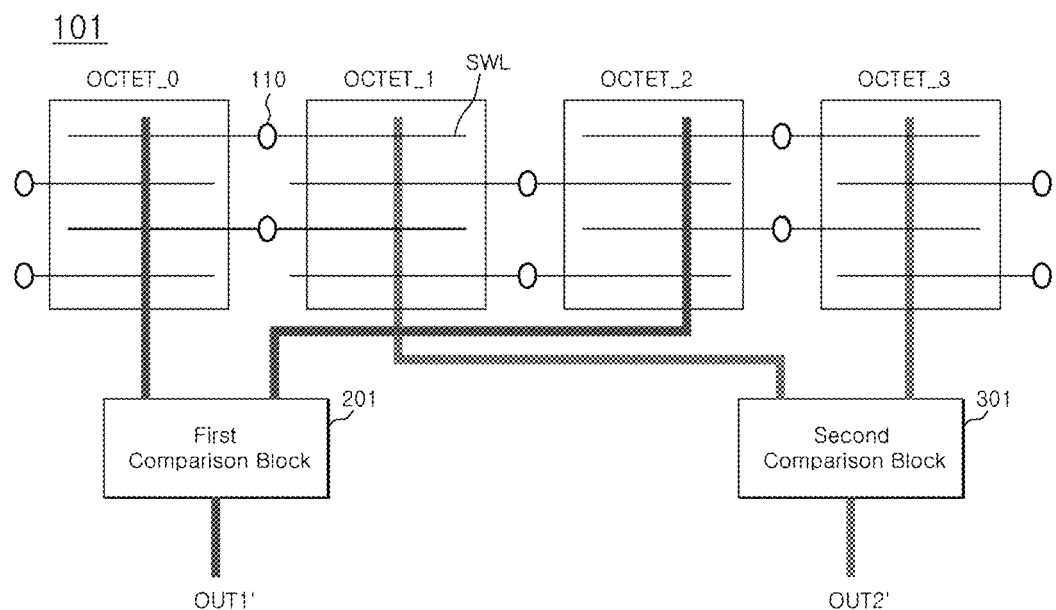
FIG. 3 is a block diagram representation of an embodiment of a test circuit of a semiconductor apparatus.

As shown in FIG. 3, an embodiment of a test circuit 101 of a semiconductor apparatus may include a plurality of memory blocks OCTET_0, OCTET_1, OCTET_2, OCTET_3, a first comparison block 201, and a second comparison block 301.

A plurality of word lines, such as for example, a plurality of sub word lines SWL may be disposed in the plurality of memory blocks OCTET_0, OCTET_1, OCTET_2, OCTET_3.

A plurality of sense amplifiers 110 are shared by pairs of adjacent memory blocks among the plurality of memory blocks OCTET_0, OCTET_1, OCTET_2, OCTET_3.

A first subset of the plurality of the memory blocks OCTET_0. OCTET_1, OCTET_2, OCTET_3, such as for example the memory blocks OCTET_0 and OCTET_1 may share even-numbered sub word lines SWL. A second subset of the plurality of the memory blocks OCTET_0. OCTET_1, OCTET_2, OCTET_3, such as for example the memory blocks OCTET_1 and OCTET_2 may share odd-numbered sub word lines SWL. A third subset of the plurality of the memory blocks OCTET_0. OCTET_1, OCTET_2, OCTET_3, such as for example the memory blocks OCTET_2 and OCTET_3 may share even-numbered sub word lines SWL.

The sense amplifiers 110 may be electrically coupled to the shared sub word lines SWL and may be configured to perform input/output of data operations via the shared sub word lines SWL.

The first comparison block 201 may be configured to select a pair of alternate memory blocks OCTET_0 and OCTET_2 in the series of the plurality of memory blocks OCTET_0, OCTET_1, OCTET_2, OCTET_3, and to compare the data of the selected pair of alternate memory blocks OCTET_0 and OCTET_2.

The second comparison block 301 may be configured to select a pair of alternate memory blocks OCTET_1 and OCTET_3 in the series of the plurality of memory blocks OCTET_0 OCTET_1, OCTET_2, OCTET_3, and to compare the data of the selected pair of alternate memory blocks OCTET_1 and OCTET_3.

The first comparison block 201 may be configured to compare the data of two memory blocks that do not share sense amplifiers 110 and generate a comparison result signal OUT1' indicating one of a pass and a fail. An example of such a pair of alternate memory blocks is OCTET_0 and OCTET_2.

The second comparison block 301 may be configured to compare the data of two memory blocks that do not share sense amplifiers 110 and generate a comparison result signal OUT2' indicating one of a pass and a fail. An example of such a pair of alternate memory blocks is OCTET_1 and OCTET_3.

The second comparison block 301 may be configured in a manner similar to the first comparison block 201 except that the second comparison block 301 is configured to receive different input than the first comparison block 201.

Figure 4:
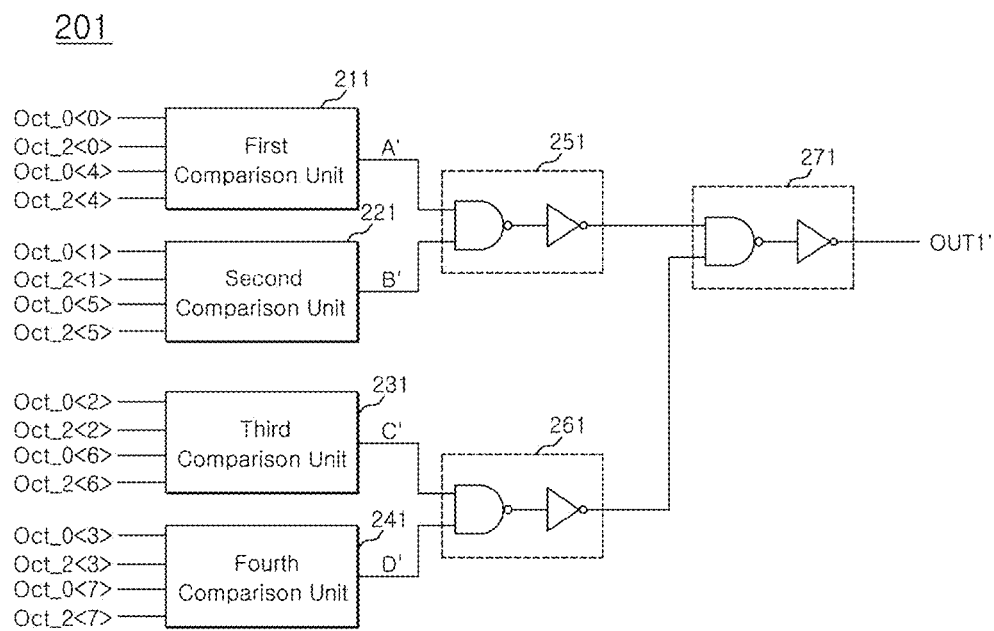
FIG. 4 is a circuit diagram representation of an example of the first comparison block shown in FIG. 3.

As shown in FIG. 4, an example of the first comparison block 201 may include first, second, third and fourth comparison units 211, 221, 231, 241 and first, second and third combination units 251, 261, 271.

The first comparison unit 211 may be configured to compare 2-bit data Oct_0<0>, Oct_2<0>, Oct_0<4> and Oct_2<4> of the memory blocks OCTET_0 and OCTET_2, and generate an output signal A'.

The second comparison unit 221 may be configured to compare 2-bit data Oct_0<1>, Oct_2<1>, Oct_0<5> and Oct_2<5> of the memory blocks OCTET_0 and OCTET_2, and generate an output signal B'.

The third comparison unit 231 may be configured to compare 2-bit data Oct_0<2>, Oct_2<2>, Oct_0<6> and Oct_2<6> of the memory blocks OCTET_0 and OCTET_2, and generate an output signal C'.

The fourth comparison unit 241 may be configured to compare 2-bit data Oct_0<3>, Oct_2<3>, Oct_0<7> and Oct_2<7> of the memory blocks OCTET_0 and OCTET_2, and generate an output signal D'.

The first combination unit 251 may be configured to receive the output signal A' of the first comparison unit 211 and the output signal B' of the second comparison unit 221 as inputs and perform an AND operation on the received inputs.

The second combination unit 261 may be configured to receive the output signal C' of the third comparison unit 231 and the output signal D' of the fourth comparison unit 241 as inputs and perform an AND operation on the received inputs.

The third combination unit 271 may be configured to receive the output signal of the first combination unit 251 and the output signal of the second combination unit 261 as inputs, and generate the comparison result signal OUT1' based on the received inputs.

Each of the first, second, third and fourth comparison units 211, 221, 231, 241 may include a 4-input XNOR gate.

Figure 5:
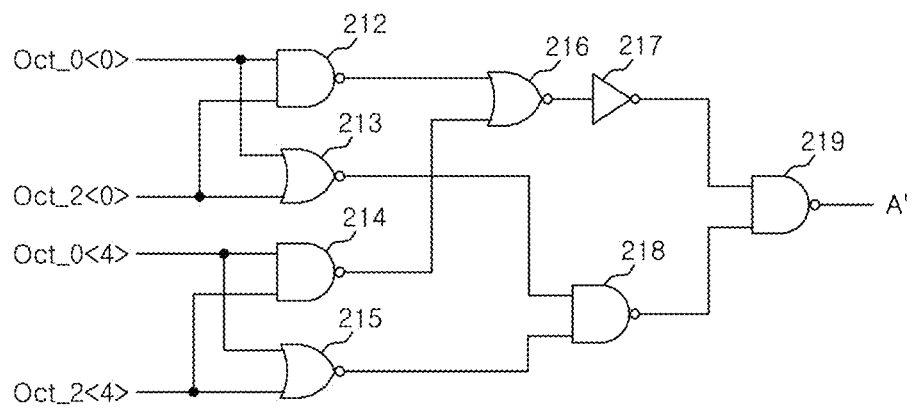
FIG. 5 is a circuit diagram representation of an example of the first comparison unit shown in FIG. 4.

For example, as shown in FIG. 5, the first comparison unit 211 may implement the 4-input XNOR gate using a plurality of logic gates 212, 213, 214, 214, 216, 217, 218, 219.

The logic gate 212 may be configured to receive the data Oct_0<0> and Oct_2<0> from the memory blocks OCTET_0 and OCTET_2, respectively, as inputs, respectively and perform a NAND operation on the received inputs.

The logic gate 213 may be configured to receive the data Oct_0<O> and Oct_2<0> from the memory blocks OCTET_0 and OCTET_2, respectively, as inputs and perform a NOR operation on the received inputs.

The logic gate 214 may be configured to receive the data Oct_0<4> and Oct_2<4> from the memory blocks OCTET_0 and OCTET_2, respectively, as inputs and perform a NAND operation on the received inputs.

The logic gate 215 may be configured to receive the data Oct_0<4> and Oct_2<4> from the memory blocks OCTET_0 and OCTET_2, respectively, as inputs and perform a NOR operation on the received inputs.

The logic gates 216 and 217 may be configured to receive the outputs of the logic gates 212 and 214 as inputs and perform an OR operation on the received inputs.

The logic gate 218 may be configured to receive the outputs of the logic gates 213 and 215 as inputs and perform a NAND operation on the received inputs.

The logic gate 219 may be configured to receive the outputs of the logic gates 217 and 218 as inputs, perform a NAND operation on the received inputs, and output the result of the NAND operation as the output signal A'.

The first, second, third and fourth comparison units 211, 221, 231, 241 may be configured to generate their respective output signals A' to D' having a low logic level when the logic levels of the two data received from different memory blocks fail to correspond to each other.

For example, when the logic levels of the data Oct_0<0> and Oct_2<0> fail to correspond to each other and the logic levels of the data Oct_0<4> and Oct_2<4> fail to correspond to each other occurs, the first comparison unit 211 is configured to generate the output signal A' with a low logic level. The output signal A' having a low logic level indicates a failure of the test.

When the sense amplifier 110 operates in an improper manner with respect to the two memory blocks sharing the sense amplifier 110 the corresponding output data may be sensed as erroneous levels. An example of two memory blocks sharing the sense amplifier 110 is the memory blocks OCTET_0 and OCTET_1.

For example, in a write operation during a test process, it is assumed that the data Oct_0<0> and Oct_1<0> of the memory blocks OCTET_0 and OCTET_1 are written as a high logic level. When one data Oct_0<0> of the data Oct_0<0> and Oct_1<0> is erroneously written to a low logic level, it is assumed to be due to a failure of a memory cell.

In a normal test operation, the data Oct_0<0> and Oct_1<0> are typically generated at a low logic level and at a high logic level, respectively.

If the data Oct_0<0> and Oct_1<0> are generated at different levels, for example, a low logic level and a high logic level, respectively, a corresponding test result will indicate a failure.

There may be a case where both the data Oct_0<0> and Oct_1<0> are generated at a low logic level or at a high logic level due to an improper operation of the sense amplifier 110 where the sense amplifier 110 is shared by the memory blocks OCTET_0 and OCTET_1.

In such a case, since the data Oct_0<0> and Oct_1<0> is generated at the same logic level, a corresponding test result may indicate a passing of the test.

In an embodiment, the first comparison block 201 and the second comparison block 301 may be configured in such a way as to compare the data of two memory blocks that do not share sense amplifiers 110, such as for example, the memory blocks OCTET_0 and OCTET_2 and the memory blocks OCTET_1 and OCTET_3. Such a configuration may result in an improvement in the reliability of the test operation.

Figure 6:
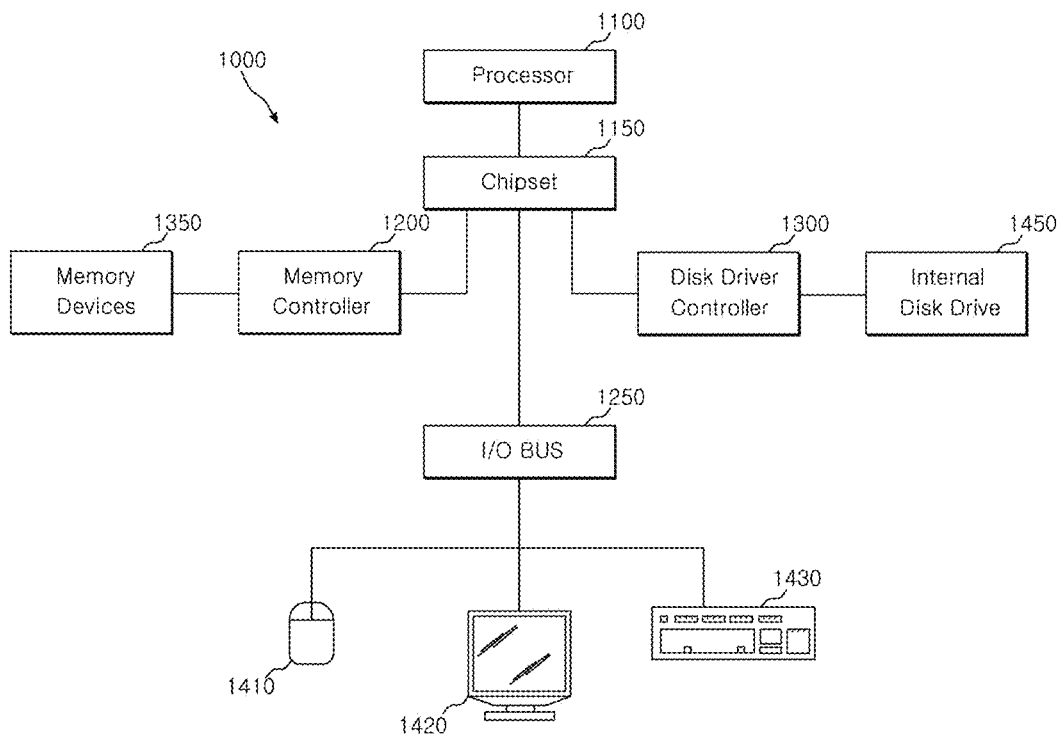
FIG. 6 is a block diagram representation of a system including a semiconductor apparatus including an embodiment of a test circuit.

Referring to FIG. 6, a block diagram representation of a system 1000 including an embodiment of a semiconductor device 1350 is shown. In an embodiment, the semiconductor device 1350 is the semiconductor device including the test circuit of FIG. 1. In an embodiment, the semiconductor device 1350 is the semiconductor device including the test circuit of FIG. 3. The system 1000 includes one or more semiconductor memory devices 1350 and a memory controller 1200

In an embodiment, the semiconductor device 1350 is a semiconductor memory device. In an embodiment, a system includes a memory controller and a semiconductor memory device including a test circuit. The test circuit includes a plurality of memory blocks and a comparison block configured to compare data of two of the plurality of memory blocks, wherein the two of the plurality of memory blocks do not share word lines.

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 6 is merely one example of a system employing a semiconductor memory device 1350. In alternate embodiments, such as cellular phones or digital cameras, the components may differ from the embodiment shown in FIG. 6.

While certain embodiments have been described above, it will be understood to those skilled in the art that the embodiments described are by way of example only. Accordingly, the test circuit of a semiconductor apparatus described herein should not be limited based on the described embodiments. Rather, the test circuit of a semiconductor apparatus described herein should only be limited in light of the claims that follow when taken in conjunction with the above description and accompanying drawings.

What is claimed is:

1. A test circuit of a semiconductor apparatus, comprising:
a plurality of memory blocks; and
a comparison block configured to compare data of two alternating memory blocks of the plurality of memory blocks,
wherein directly adjacent memory blocks of the plurality of memory blocks are directly connected by word lines, and
wherein the two of the plurality of memory blocks compared by the comparison block are not directly connected by a word line.

2. The test circuit according to claim 1, wherein the plurality of memory blocks are configured to share, by the unit of a pair of memory blocks, one of even-numbered word lines and odd-numbered word lines.

3. The test circuit according to claim 1, wherein the comparison block is configured to perform a parallel test in where pluralities of data of the two memory blocks are compared with each other, wherein the two memory blocks do not share word lines.

4. The test circuit according to claim 1, wherein the word lines comprise sub word lines.

5. A test circuit of a semiconductor apparatus, comprising:
a plurality of memory blocks;
a first comparison block configured to select a first pair of alternate memory blocks in series of the plurality of memory blocks, and to compare data of the selected first pair of alternate memory blocks; and
a second comparison block configured to select a second pair of alternate memory blocks in the series of the plurality of memory blocks, and to compare data of the selected second pair of alternate memory blocks, wherein the memory blocks in the first pair of memory blocks are different from the memory blocks in the second pair of memory blocks,
wherein directly adjacent memory blocks of the plurality of memory blocks are directly connected by word lines, and
wherein the two of the plurality of memory blocks compared by the comparison block are not directly connected by a word line.

6. The test circuit according to claim 5, wherein the first pair of alternate memory blocks selected by the first comparison block and second pair of alternate memory blocks selected by the second comparison block are configured to not share word lines.

7. The test circuit according to claim 6, wherein the word lines comprise sub word lines.

8. The test circuit according to claim 5, wherein the first pair of alternate memory blocks selected by the first comparison block and the second pair of alternate memory blocks selected by the second comparison block are configured to not share sense amplifiers.

9. The test circuit according to claim 5, wherein the first comparison block is configured to perform a parallel test where pluralities of data of the first pair of alternate memory blocks selected by the first comparison block are compared with each other.

10. The test circuit according to claim 5, wherein the second comparison block is configured to perform a parallel test where pluralities of data of the second pair of alternate memory blocks selected by the second comparison block are compared with each other.

11. A system comprising:
a memory controller; and
a semiconductor memory device including a test circuit, the test circuit comprising:
a plurality of memory blocks; and
a comparison block configured to compare data of two alternating memory blocks of the plurality of memory blocks,
wherein directly adjacent memory blocks of the plurality of memory blocks are directly connected by word lines, and
wherein the two of the plurality of memory blocks compared by the comparison block are not directly connected by a word line.

12. The system according to claim 11, wherein the plurality of memory blocks are configured to share, by the unit of a pair of memory blocks, one of even-numbered word lines and odd-numbered word lines.

13. The system according to claim 11, wherein the comparison block is configured to perform a parallel test in where pluralities of data of the two memory blocks are compared with each other, wherein the two memory blocks do not share word lines.

14. The system according to claim 11, wherein the word lines comprise sub word lines.

* * * * *